United States Patent [19]

Ele

[11] 4,454,585
[45] Jun. 12, 1984

[54] PRINTED WIRING BOARD INSPECTION, WORK LOGGING AND INFORMATION SYSTEM

[76] Inventor: John H. Ele, 584 34th St., Sacramento, Calif. 95816

[21] Appl. No.: 267,939

[22] Filed: May 28, 1981

[51] Int. Cl.³ .................. G06F 15/20; G01R 15/12
[52] U.S. Cl. ..................... 364/507; 73/587; 324/73 PC; 364/552
[58] Field of Search ............... 364/505–508, 364/550–552, 580; 324/73 R, 73 AT, 73 PC, 324/158 R, 158 D, 158 F, 52; 73/570, 577, 587, 760, 73/763, 801

[56] References Cited

U.S. PATENT DOCUMENTS

| | | | |
|---|---|---|---|
| 3,143,702 | 8/1964 | Kohler et al. | 324/73 |
| 3,371,780 | 3/1968 | Clark | 209/73 |
| 3,564,408 | 2/1971 | Schulz et al. | 324/158 |
| 3,803,413 | 4/1974 | Vanzetti et al. | 250/338 |
| 3,857,091 | 12/1974 | Kalifon | 324/52 |
| 3,965,726 | 6/1976 | Vahaviolos | 73/587 |
| 3,991,302 | 11/1976 | Danner | 235/151.31 |
| 4,024,522 | 5/1977 | Clark et al. | 73/587 |
| 4,142,237 | 2/1979 | Yamasaki | 364/507 |
| 4,218,922 | 8/1980 | Ensminger | 73/588 |
| 4,277,977 | 7/1981 | Lubitz et al. | 73/587 |
| 4,287,766 | 9/1981 | Ensminger | 73/582 |
| 4,357,575 | 11/1982 | Uren et al. | 324/73 PC |

OTHER PUBLICATIONS

"Yag-Laser Inspection of Solder Joints Would Speed Processing of PC Boards"; *Laser Focus*, Jun. 1980, p. 42.
Abstract of "Station to Automatically Inspect Solder Joints on Printed Circuit Boards (PCB'S) With Computer Aids", *Materials Evaluation*, Feb. 1980, vol. 38, No. 2.

Primary Examiner—Errol A. Krass
Attorney, Agent, or Firm—Donald J. Singer; Jacob N. Erlich

[57] ABSTRACT

A printed wiring board inspection, work logging and information system having a plurality of inspection and identification stations therein. The inspection stations include an ultrasonic and thermal testing station as well as a video testing station while the identification stations include circuit board identification as well as repair record identification. The information obtained from these stations as well as information obtained from circuit wiring boards positioning are fed into a computer which processes this information into an output which sets forth lists of defective joints, views of defective joints, instructions for board disposition, history of board repair and analysis of board history.

7 Claims, 1 Drawing Figure

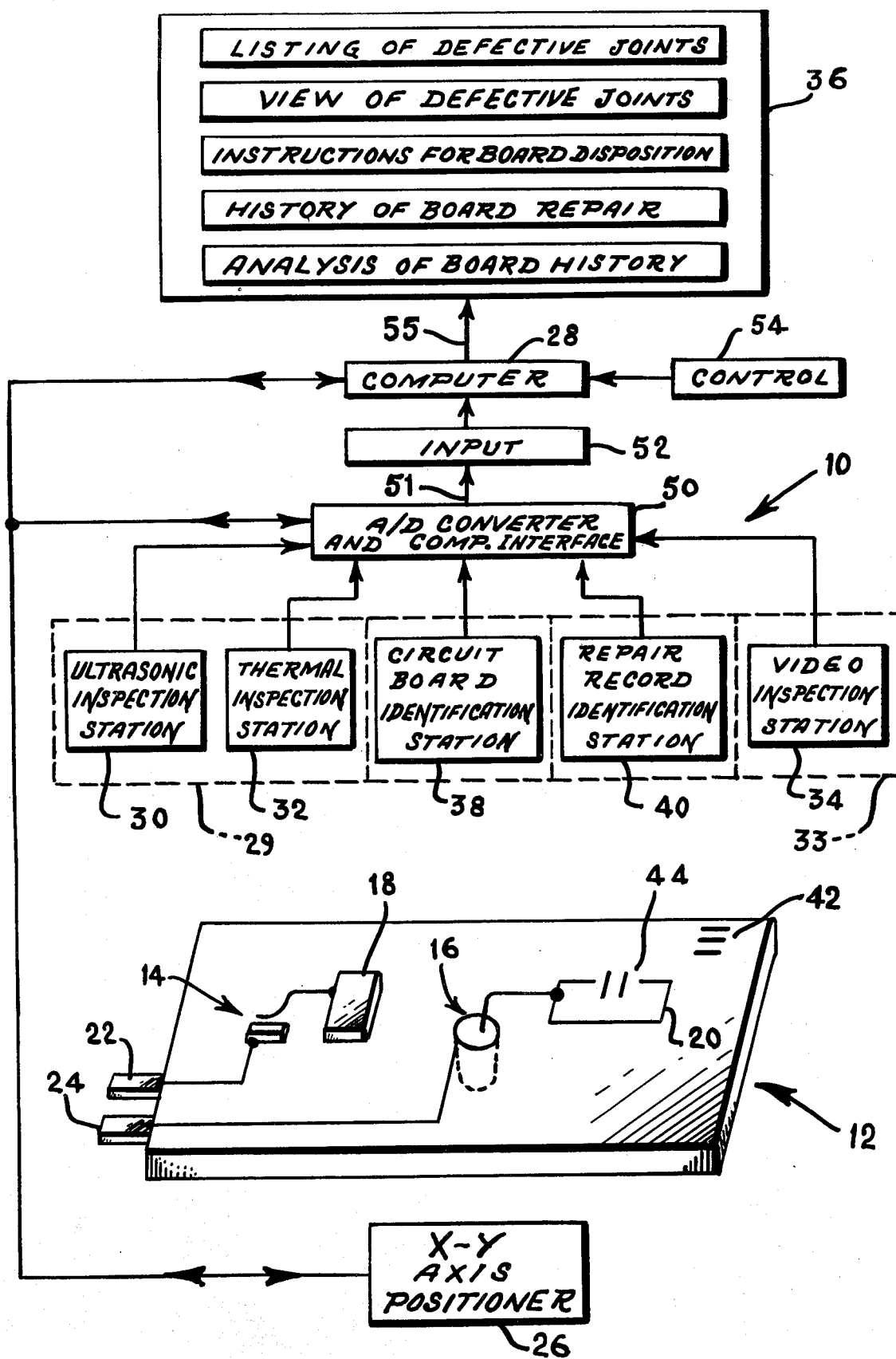

PRINTED WIRING BOARD INSPECTION, WORK LOGGING AND INFORMATION SYSTEMA

STATEMENT OF GOVERNMENT INTEREST

The invention described herein may be manufactured and used by or for the Government for governmental purposes without the payment of any royalty thereon.

BACKGROUND OF THE INVENTION

This invention relates generally to printed wiring board inspection systems, and, more particularly to a printed wiring board inspection and information system which incorporates therein two active inspections in the form of a combined thermal and an ultrasonic testing station, a passive inspection in the form of a video or visual display, and an information station setting forth data relating to printed wiring board identification as well as repair records, and the like.

Printed wiring boards, or in some cases known as printed circuit boards, have recently found its way into use in almost every electronic system. One such use is the electronic network of, for example, aircraft. As is quite readily apparent any intermittent operation or failure of such printed circuit boards or printed wiring boards in an aircraft can be degrading to the mission, or, at the least require extensive effort, that is a distraction to the pilot, to overcome problems encountered as a result of the defectiveness of such boards.

In many instances, an intermittent defect cannot be isolated during ground and shop testing. Therefore, the printed circuit board is generally reinstalled on an operational aircraft for subsequent use. When a printed circuit board shows repeated malfunction in the air but not in ground testing, it is returned to a depot for complete overhaul. At the depot, it is still possible for the printed circuit board to pass both functional, electrical and mechanical testing without isolating the marginal solder connections used therein.

Current depot level quality assurance techniques utilize mainly visual and mechanical methods to insure the physical integrity of solder joints of microelectronic circuits. Therefore, these cracked solder joints can be inspected only in the vertical plane and hidden defects such as voids between the lead and pad, foreign inclusions such as dirt, oil and flux, and internal cracks cannot be detected. Even the less complex assemblies have more than 150 densely packed joints requiring inspection. The more complex assemblies have over 1,000 joints. As mentioned above the existing techniques do not find many hidden defects and so an extremely high percentage of joints on a printed circuit board are marginal and will progress to failure.

In recent years, two tests have been developed which are able to reduce the amount of printed circuit board or printed wiring board failures. Such tests are set forth in the following U.S. Pat. Nos. 3,803,413 and 4,218,922. An even more recent technique is discussed in *Laser Focus*, vol. 16, no. 6, June 1980, pg. 42.

Unfortunately, reliance on such tests in and by themselves leave much to be desired. First of all each test although effective to some degree, still fails to accurately, by itself, detect all flaws within the printed circuit or wiring board. Therefore, it is highly desirable to provide a system which is capable of providing highly accurate printed wiring board inspection. In addition, once this inspection is complete it would be even more desirable to have a substantially instantaneous analysis of this inspection as well as additional real time information of wiring board history and identification. In addition, it would be even more desirable to combine with inspections fast, accurate, and comprehensive automatic work logging. This would eliminate slow inaccurate and manual work logging of each repaired or reworked content of printed wiring boards.

SUMMARY OF THE INVENTION

The present invention overcomes the problems encountered in the past and as set forth in detail hereinabove by providing a printed wiring board inspection and information system which is completely automated and highly reliable.

This invention incorporates within the inspection and information system a combined thermal and ultrasonic inspection station which can sense, log and display the results of these inspections pertaining to standards of cracks in individual solder joints, or to standards of process defects in individual solder joints on printed wiring boards. In addition, if appropriate, a supplemental visual or video inspection station provides a view of solder joints which have received contradictory information from the thermal and ultrasonic test stations.

Also incorporated with this invention is a display or printed output which analyzes the above information in conjunction with information relating to the particular circuit wiring board inspected, instructions for board disposition, and information on rework or repair of the board. Furthermore, a display of the repair history of each individual board along with history and trends of repair can be provided.

It is therefore an object of this invention to provide a printed wiring board inspection and information system which is capable of detecting a wide variety of solder joint defects in printed wiring boards.

It is another object of this invention to provide a printed wiring board inspection and information system which combines thermal, ultrasonic and visual inspection stations for detecting solder joint defects.

It is a further object of this invention to provide a printed wiring board inspection and information system which incorporates therein a complete analysis of board informaton as well as repair history and which eliminates manual work logging.

It is still a further object of this invention to provide a printed wiring board inspection and information system which is economical to produce and which utilizes conventional, currently available components that lend themselves to standard mass producing manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

The only FIGURE of the drawing is a schematic representation, shown partially in pictorial fashion, of the printed wiring board inspection and information system of this invention having a printed wiring board passing therebeneath.

DETAILED DESCRIPTION OF THE PREFERRED EMBODIMENT

Reference is now made to the only FIGURE of the drawing which illustrates the printed wiring board inspection and information system 10 of this invention. The printed wiring board inspection and information system 10 is utilized in conjunction with a device which by way of example, but not limitation, is in the form of a printed wiring board 12 upon which a plurality of discrete components have been mounted. Such components may consist of resistors, capacitors, inductive devices, semi-conductor devices, or other electronic components. It should be understood, however, that the device need not necessarily be a printed wiring board but may be in the form of any other type of similar electronic device having discrete components thereon which require solder-type connections. As shown in the FIGURE of the drawing, typical solder-type connections may be in the form of a lap type joint 14 or feed-through type joint 16 in order to connect component 18 and 20, for example, to conventional input and output pins 22 and 24, respectively.

The printed wiring board 12 is held in position on any conventional x-y axis positioner 26, which is utilized to position the printed wiring board 12 in the appropriate location for inspection and identification by system 10 of this invention. Although the exact manner in which printed wiring board 12 and positioner 26 are interconnected to each other is not illustrated, reference can be made to U.S. Pat. No. 3,803,413 by Vanzetti et al which clearly discloses a similar type of positioner for moving a printed wiring board beneath an inspection station. Information with respect to movement of printed wiring board 12 relative to the inspection and identification stations 30, 32, 38 and 40 (more clearly described below) can be input into any conventional memory-computer 28, such as for example, Model 6800 manufactured by Motorola Corporation. The details of computer 28 need not therefore be given. However, a more specific description of the interrelationship between the various elements making up the inspection and identification system 10 of this invention will be set forth hereinbelow.

Inspection and identification system 10 incorporates therein a combined active inspection unit 29 made up of an acoustic or ultrasonic inspection station 30 and a thermal inspection station 32 and a passive inspection unit 33 in the form of a video inspection station 34. The acoustic or ultrasonic inspection station is conventional, the details of which can be found in U.S. Pat. No. 4,218,922 issued Aug. 26, 1980 and referred to hereinabove. Station 30 makes use of the ultrasonic properties of the solder joints and how they vary depending upon the joint structure. Inspection station 30 may use either acoustic transmission or reflection or change in acoustic impedance for defect analysis. The thermal inspection station 32 is also conventional and a description of that station can be found in either U.S. Pat. No. 3,803,413 issued Apr. 9, 1974 or in an article entitled "Yag/Laser Inspection of Solder Joints Would Speed Processing of PC Boards" found in *Laser Focus*, vol. 16, no. 6., June 1980, pg 42. With thermal inspection station 32 the solder joint can be heated. The resultant cooling characteristic (using IR sensing) is then compared graphically and rapidly to the curve of a known good solder joint of the same type. Good thermal characteristics usually denote good mechanical and electrical characteristics. Display is rapid as the information from stations 30 and 32 along with the location of the various points on printed wiring board 12 are fed through computer 28 for a visual output on display 36.

Under certain circumstances, a video inspection station 34 sets forth preferably a 3-D visual representation of the solder joint under inspection. The visual examination is usually by way of a multi-lens (probably 3 or 4) color video system of conventional design. Results of this visual inspection may also be processed through computer 28 and output on display 36.

It is necessary with this invention to provide two active inspections with stations 30 and 32 in a single inspection unit 29. In this manner stations 30 and 32 are complementary to each other. Each active station 30, 32 inspects defects that the other cannot readily inspect; thus, the use of two active inspections in a single unit 29 increases the number of defect standards inspected. With such an operation a great increase in accuracy of inspection results and therefore allows for the use of more acceptable printed wiring boards 12.

In cases of doubt, where, for example, the thermal and ultrasonic inspection stations render contradictory results, a supplementary visual (passive) inspection station 34 permits the station operator to actually see the joint which has been inspected in great detail. This visual inspection is performed by the use of a video display. Information received from stations 30, 32 and 34 can be stored and analyzed by computer 28 so as to produce a visual or printed output. This information is extremely valuable for future soldering, engineering, and board disposition control after board assembly.

The following types of defects can be readily examined by the inspection stations 30, 32 and 34 of system 10 of this invention:

(1) cold solder joints,
(2) irregular solder spreading due to excessive heat,
(3) irregular solder spreading due to insufficient heat,
(4) toe of lead bent up,
(5) lead soldered one-half off pad,
(6) tipped lead,
(7) yellow flat top lead,
(8) flux contaminated solder joint,
(9) voids in solder,
(10) cracks at heel of joint,
(11) granular appearance,
(12) surface cracks,
(13) insufficient solder,
(14) excessive solder,
(15) excessive heat,
(16) no fillet at heel of lead,
(17) dewetted joint,
(18) holes and/or pits,
(19) solder peaks,
(20) inclusions,
and of course good solder joints.

More specifically the ultrasonic technique utilized by inspection station 30 detects actual open joints with virtually 100% accuracy. Further, cracks, voids or inclusions that affect 30% or more of a joint can be detected with an estimated accuracy of 95% or greater. If the area of the joint affected is from 15% to 30% for these defect types the estimated accuracy is approximately 90%. Cold solder joints that actually give a granular or cloudy visual appearance can be detected with greater than 90% accuracy. Partial cold joints give a lower confidence of detection. Those joints that may be considered "cosmetic" in nature, such as excess solder, irregular spreading or toe of lead bent probably will not be detected unless there is some other defect present in the joint. The overall detection accuracy of the ultrasonic technique, considering all defects, is approximately 90%.

The thermal inspection provided at station 32 will detect actual open joints with 100% accuracy unless there is an excessive amount of solder or if there is exposed gold on the lead. These conditions could mask the detection by laser/IR alone. The probablity of detection of voids or inclusions that effect 50% or more of a joint is estimated to exceed 70% with the same constraint as above. Cold solder joints would be detected with the same accuracy as the ultrasonic technique. The laser/IR technique also will give a warning at least 50% of the time that a joint is suspect if there is a significant amount of exposed gold, or if there is excessive solder present, or for many cases of excessive heating. The current estimate of this type of inspection technique would exceed 70%.

The thermal inspection provided at station 32 can be varied slightly to improve accuracy of inspection. The same joint can be inspected at two or more locales. Joint reflectance information can be considered as well as the thermal response information. With added information, such defects as cracks that affect 50% or more of a joint and overheat conditions that darken a joint can be detected with an estimated accuracy of 70% or greater.

There may, however, be certain types of solder joints for which neither thermal station 32 or ultrasonic station 30 will provide a definite test. Therefore, whenever either of these techniques detect solder joints that cannot be expressly designated as "bad" or "good", those joints will be subject to video inspection station 34. A closed-circuit television, (CCTV color) conventional in its construction, is utilized for the final inspection of solder joints identified as being questionable by either inspection station 30 or inspection station 32. The CCTV would be made up of a multi-lens color subsystem that would permit simultaneous viewing of all visible parts of a solder joint at sufficient magnification to provide good resolution. Display would be either a separate 12-inch monitor for each lens or a single 25-inch color model used in a split-screen mode. In the latter case, there would be the option of using the picture from any of the lenses as a full screen display. Video system 34 also can be used to inspect the non-lap type joint on the printed wiring board thus making for a complete inspection of all solder joints on printed wiring board 12. The information from video station 34 as well as the information from the ultrasonic and thermal inspection stations 30 and 32, respectively will be output on display board 36.

Completing the inspection and information system 10 of this invention are a circuit board identification station 38 and a repair record identification station 40. For a detailed explanation of these stations 38 and 40 it is first necessary to refer once again to the printed wiring board 12. Wiring board 12 is coded in two manners. One coding refers to the particular type of printed wiring board 12 utilized and is in the form of marks 42 located, perhaps, at a corner of printed wiring board 12. Marks 42 may be representative of, for example, a serial number or other type of identification of the board 12. In addition each component which is soldered to the board 12 will have marks 44 associated therewith representative of rework or repair information. Circuit board identification station 38 will read marking 42 while repair record identification station 40 will read mark 44 as these marks pass therebeneath.

Any conventional laser reading system may be utilized with stations 38 and 40 to interpret the coding of marks 42 and 44. In this manner a complete record of the type of circuit wiring board 12 or the particular type of repair record associated with the components thereon can be quickly fed into computer 28 for output on display board 36.

For mark 44 and procedures for use of this mark in recording board rework and repair to be totally comprehensive of the possibilities of rework and repair on the content of boards, conventions can be reached with persons accomplishing the rework and repair, and these conventions can be integrated into station software. Then such a convention and code as existance of a laser readable mark on the top center of a replacement electronic device identifies both device replacement and new soldering to be inspected. In addition, such a convention on board 12 near pin 24 of the input/output electrical connector identifies printed wiring repair; near pin 22 another such repair, and so forth. Furthermore, a similar convention for quantity of the same repair can be in the form of marks situated at a particular corner of board 12.

The interrelationship between computer 28, the various stations 30, 32, 38, 40 and 34 as well as the x-y axis position of board 12 by axis positioner 26 is accomplished in a conventional manner. Basic control and processing for system 10 of this invention is provided by memory-computer 28 which may be in the form of any small computer of the type identified above including a memory for the storage of information. Since such computers are well known and available on the market, computer 28 need not be described in detail.

Computer 28 is interfaced with the rest of system 10 by a conventional analog to digital converter and computer interface 50. The function of the analog to digital converter and computer interface 50 is to convert the analog information received from the various stations 30, 32, 34, 38, and 40 as well as from x-y axis positioner 26 and to convert this information to digital information which can be handled by computer 28 as well as interface such information with computer 28. The output 51 from analog to digital converter and computer interface 50 is fed through any conventional input device 52 into computer 28 and can be controlled by external control means 54. The output 55 of computer 28 which is displayed on a conventional display unit 36 which displays the information as, for example, a listing of defective joints, a view of defective joints, instructions for board disposition, history of board repair and analysis of board history.

MODE OF OPERATION

As the printed wiring board 12 passes beneath the plurality of stations, at the ultrasonic inspection station 30 of the type set forth in U.S. Pat. No. 4,218,922 a transmitter injects ultrasonic energy into an inspected joint and a receiver compares ultrasonic energy received to that of a known good joint. One or more of the following phenomena may be compared:

(1) the total increase in energy response of an inspected joint in comparison to a good joint;

(2) the particular energy increase in a restricted band or bands of frequency; and (3) any special pattern or energy response, i.e., a more refined signature analysis.

In the comparison of an inspected joint to a known good joint, these set type standards have spectrums of energy that are in excess of the minimum spectrum of energy of a good joint standard. This phenomena are used singly or in combination to identify solder joint cracks, process defects, and quality.

It is possible at thermal inspection station 32 for a laser injected IR as described in *Laser Focus* cited above to heat a joint and then for an IR sensor to compare the inspected joint thermal signal changes to that of a known good joint. In the comparison of the inspected joint to a known good joint, one or more of the following phenomena may be compared:

(1) the rate of signal rise as the inspected joint is heated;

(2) the maximum signal reached at the time that the IR injected heat is turned off;

(3) the rate of the signal fall of the inspected joint; and (4) the detailed signature fluctuations that may occur in one or more of the above periods of time.

The mass differences, differences of cavities and solder joints, and thermal absorptivity differences in some instances considered with information from inspecting a joint at different locales and with reflectance information allow for identification of solder joint cracks, process defects and quality.

The above description involves both ultrasonic and thermal inspection for solder joint cracks, process defects, and quality. In regard to the thermal inspection method four phenomena were listed to differentiate the inspected joint from a known good joint and for the ultrasonic or acoustic inspection method three phenomena were listed to differentiate the inspected joint from a known good joint. Defect types readily identified by both methods have been identified above. The thermal method and ultrasonic method are complementary. Using combined instructions in a single inspection unit 29 those things that are readily inspected by the thermal method and those that are readily inspected by the ultrasonic method thereby increase the accuracy of the reporting.

For severe standard cavity cracks, highest thermal and ultrasonic responses were usually reported for the standard defect test joints; thus, highest probability will exist of an actual defective condition for recording by either the thermal method or the ultrasonic method. For either recording, therefore, the inspection philosphy can be to repair the joint without further viewing. For even higher probablity, the inspection philosophy can be to repair without viewing only for combined thermal/ultrasonic no-goes. For at least a simultaneous suspect recording by both the thermal and ultrasonic methods, the inspection philosphy can be to also view the joints by means of video inspection station 34.

An analysis of the various solder joint conditions will then be compared within computer 28 for the particular type of printed wiring board 12 utilized. That is, code or mark 42 associated with each printed wiring board 12 will be recorded in conjunction with the actual types of defects found in the various printed circuit boards. In addition, a code 44 will list prior rework or repair of a particular type of solder joint under inspection. This information will also be output on display 36. By assigning a specific code representative of board repair this repair can be marked, sent, logged, analyzed and automatically reported by system 10 of this invention.

Although this invention has been described with reference to a particular embodiment, it will be understood that this invention is also capable of further and other embodiments within the spirit and scope of the appended claims.

I claim:

1. A system for inspecting and providing information with respect to the type, history, and repair record of a device having electrical components therein and solder joints associated therewith comprising:
   (a) means for supporting said device, moving said device to a plurality of positions in two directions and providing a signal indicative of said positions;
   (b) means juxtaposed said device for inspecting said solder joints thermally and providing a signal indicative of the condition of said solder joints;
   (c) means juxtaposed said device for inspecting said solder joints acoustically and providing a signal indicative of the condition of said solder joints;
   (d) means juxtaposed said device for inspecting said solder joints visually and providing a signal representative of the condition of said solder joints, said visual inspection means becoming operable based upon the type of signals provided from said thermal inspection means and said acoustic inspection means;
   (e) means juxtaposed said device for examining said device and providing a signal reresentative of information about said device being inspected;
   (f) coded marks located on said device and said components for providing information about said components and solder joints on said device being inspected;
   (g) means juxtaposed said device for reading said coded marks and providing a signal representative of information about said components and said solder joints on said device being inspected; and
   (h) means for receiving said signals from said supporting means, said thermal inspection means, said acoustic inspection means, said visual inspection means, said device examining means, and said means for reading said coded marks, and correlating said signals into an output indicative of the acceptability or nonacceptability of said solder joints.

2. A system for inspecting and providing information with respect to the type, history and repair record of a device having electrical components therein and solder joints associated therewith as defined in claim 1 wherein said thermal inspection means and said acoustic inspection means are operable as a single unit.

3. A system for inspecting and providing information with respect to the type, history and repair record of a device having electrical components therein and solder joints associated therewith as defined in claim 2 wherein said visual inspection means becomes operable upon conflicting signals being provided by said thermal inspecting means and said acoustic inspecting means.

4. A system for inspecting and providing information with respect to the type, history and repair record of a device having electrical components therein and solder joints associated therewith as defined in claim 3 wherein said coded marks on said device are indicative of the type of device and said coded marks associated with said components and said solder joints are indicative of repair history of said components and said solder joints.

5. A system for inspecting and providing information with respect to the type, history and repair record of a device having electrical components therein and solder joints associated therewith as defined in claim 4 wherein said output is in the form of a display providing a listing of defective solder joints, a view of defective solder joints, instructions for device disposition, a history of device repair and an analysis of device history.

6. A method of inspecting and providing information with respect to the type, history, and repair record of a device having electrical components thereon and solder joints associated therewith comprising the steps of:
   (a) moving said device in two directions beneath a thermal inspection station, an acoustic inspection station and a visual inspection station so that solder joint inspection takes place;
   (b) inspecting said solder joints thermally and acoustically and determining the condition of said solder joints by said thermal inspection and said acoustic inspection;
   (c) visually inspecting said solder joints based upon the condition of said solder joints determined by said thermal and acoustic inspections;
   (d) providing information with respect to the type of said device and history of said components and said solder joints; and
   (e) utilizing said information with respect to the type of said device and history of said components and said solder joints in conjunction with said condition of said solder joints to provide an indication of the acceptability or nonacceptability of said solder joints.

7. A method of inspecting and providing information with respect to the type, history and repair record of a device having electrical components thereon and solder joints associated therewith as defined in claim 6 wherein said visual inspection takes places when conflicting conditions of said solder joints are determined by said thermal and acoustic inspections.

* * * * *